(12) United States Patent
Rueffer et al.

(10) Patent No.: US 9,127,350 B2
(45) Date of Patent: Sep. 8, 2015

(54) DEVICE AND METHOD FOR COATING A SUBSTRATE USING CVD

(75) Inventors: Martin Rueffer, Amberg (DE); Stefan Rosiwal, Bamberg (DE); Christian Bareiss, Aachen (DE); Walter Reichert, Aachen (DE); Oliver Lemmer, Aachen (DE); Marc Perle, Forchheim (DE)

(73) Assignees: DIACCON GMBH, Fuerth (DE); CEMECON AG, Wuerselen (DE)

( * ) Notice: Subject to any disclaimer, the term of this patent is extended or adjusted under 35 U.S.C. 154(b) by 1098 days.

(21) Appl. No.: 13/130,728

(22) PCT Filed: Nov. 13, 2009

(86) PCT No.: PCT/EP2009/065177
§ 371 (c)(1),
(2), (4) Date: Aug. 8, 2011

(87) PCT Pub. No.: WO2010/057837
PCT Pub. Date: May 27, 2010

(65) Prior Publication Data
US 2011/0287192 A1 Nov. 24, 2011

(30) Foreign Application Priority Data
Nov. 24, 2008 (DE) .......................... 10 2008 044 025

(51) Int. Cl.
*C23C 16/27* (2006.01)
*C23C 16/24* (2006.01)
*H01L 21/67* (2006.01)

(52) U.S. Cl.
CPC .............. *C23C 16/278* (2013.01); *C23C 16/24* (2013.01); *C23C 16/271* (2013.01); *C23C 16/273* (2013.01); *H01L 21/67115* (2013.01); *H01L 21/67098* (2013.01)

(58) Field of Classification Search
CPC .. C23C 16/271; C23C 16/273; C23C 16/278; C23C 16/24; H01L 21/67115; H01L 21/67098
USPC ....................................................... 118/723 HC
See application file for complete search history.

(56) References Cited

U.S. PATENT DOCUMENTS 4,342,459 A * 8/1982 Pretorius ........................ 473/575
4,958,592 A 9/1990 Anthony et al.
4,970,986 A * 11/1990 Anthony et al. .............. 118/724

(Continued)

FOREIGN PATENT DOCUMENTS

EP 0714997 6/1996
JP S64-072992 3/1989

(Continued)

*Primary Examiner* — Jeffrie R Lund
(74) *Attorney, Agent, or Firm* — Manabu Kanesaka

(57) ABSTRACT

The invention relates to a device for coating a substrate (14) using CVD, in particular for coating with diamond or silicon, wherein a heat conductor array comprising a plurality of elongated heat conductors (2) is provided in a housing (10), said heat conductors extending between a first (1) and a second electrode (8), wherein the heat conductors (2) are held individually tensioned by a tensioning device attached to one end thereof. For the purposes of improving the life of the heat conductors (2), the invention proposes that the tensioning device comprises a tilt arm (5) having a tensioning weight (G), the heat conductor (2) being attached to the first end (E1) of said tilt arm, and the second end thereof substantially being mounted pivotably about a horizontal axis (H).

15 Claims, 2 Drawing Sheets

(56) References Cited

U.S. PATENT DOCUMENTS

Figure 1:
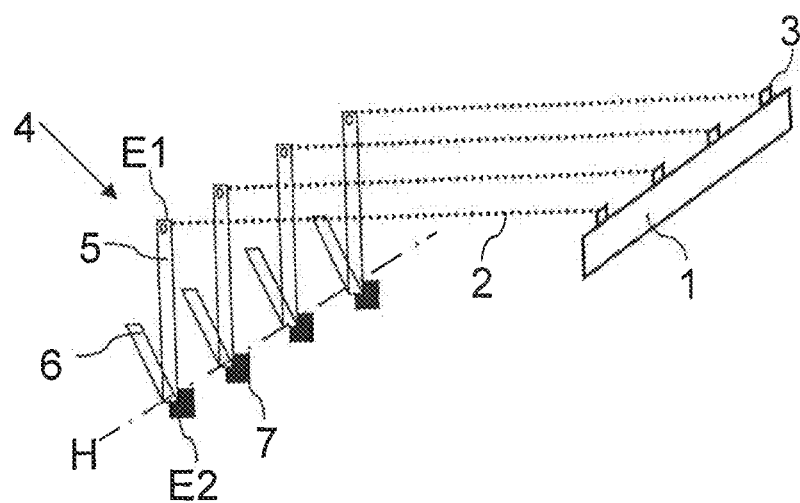

| | | | |
|---|---|---|---|
| 5,833,753 A * | 11/1998 | Herlinger et al. | 118/724 |
| 5,997,650 A * | 12/1999 | Herlinger et al. | 118/724 |
| 6,427,622 B2 * | 8/2002 | Madan et al. | 118/723 HC |
| 6,582,780 B1 | 6/2003 | Tolt | |
| 6,981,465 B2 * | 1/2006 | Chae | 118/723 HC |
| 8,272,347 B2 * | 9/2012 | Nasman et al. | 118/723 HC |
| 8,291,856 B2 * | 10/2012 | Nasman et al. | 118/723 HC |
| 8,662,941 B2 * | 3/2014 | Narwankar et al. | 439/804 |
| 8,852,347 B2 * | 10/2014 | Lee et al. | 118/724 |
| 2003/0013280 A1 * | 1/2003 | Yamanaka | 438/487 |
| 2004/0069231 A1 | 4/2004 | Chae | |
| 2008/0035059 A1 | 2/2008 | Wang et al. | |
| 2008/0035060 A1 * | 2/2008 | Wang et al. | 118/723 HC |
| 2011/0287192 A1 * | 11/2011 | Rueffer et al. | 427/568 |
| 2011/0287194 A1 * | 11/2011 | Rueffer et al. | 427/585 |
| 2012/0107501 A1 * | 5/2012 | Harig et al. | 427/248.1 |
| 2012/0114855 A1 * | 5/2012 | Harig et al. | 427/248.1 |
| 2012/0135144 A1 * | 5/2012 | Harig et al. | 427/248.1 |
| 2014/0102364 A1 * | 4/2014 | Heaney et al. | 118/712 |

FOREIGN PATENT DOCUMENTS

| | | |
|---|---|---|
| JP | H04-021777 | 1/1992 |
| JP | 2007-230799 | 9/2007 |
| WO | WO2008/003275 | 1/2008 |

\* cited by examiner

DEVICE AND METHOD FOR COATING A SUBSTRATE USING CVD

RELATED APPLICATIONS

The present application is National Phase of International Application No. PCT/EP2009/065177 filed Nov. 13, 2009 and claims priority from German Application No. 10 2008 044 025.6 filed Nov. 24, 2008 the disclosure of which is hereby incorporated by reference herein in its entirety.

The invention relates to a device as defined in the preamble of claim 1 as well as a method using the device.

Such a device is known from JP 01072992 A. The heating conductors are thereby located horizontally above the substrate to be coated. To generate a suitable tension force, the heating conductors are guided over a redirection unit and provided with a weight on their one end. The device known from prior art has the disadvantage that the heating conductors already break after one or two coating procedures and can then no longer be used. In actual practice, it is necessary to replace the heating conductors after each coating procedure. This requires a great amount of time and expense.

Although it is conceivable to use relatively thick heating conductors having a diameter of approximately 2 mm to eliminate the aforementioned disadvantage, the use of such relatively thick heating conductors also has disadvantages. In contrast to thin heating conductors, thick heating conductors generate a relatively large amount of heat radiation which affects the substrates in an undesirable way. Apart from this, a significantly greater amount of electrical power is required to heat thicker heating wires.

The object of the invention is to eliminate the disadvantages of prior art. In particular, a device is to be specified which permits multiple coating of substrates without having to replace the heating conductors.

According to a further goal of the invention, the amount of electrical power used should thereby be as low as possible. A further object of the invention is the specification a method which is as efficient as possible for coating a substrate using CVD.

This object is resolved by the features of claims 1 and 14. Advantageous embodiments of the invention result from the features of claims 2 to 13 and 15.

According to the provisions of the invention, it is provided that the tension unit comprises a swivel arm having a tension weight, the heating conductor being mounted on one end of the swivel arm and the other end of the swivel arm being mounted pivotably essentially around a horizontal axis.—Surprisingly, this drastically increases their life even when thinner heating conductors are used. By applying the tension weight as provided by the invention via a swivel arm to the heating conductor, a tension force generated by this essentially acts in the direction of the longitudinal extension of the heating conductor. Changes in the length of the heating conductor due to thermal conditions during heating up or cooling off are compensated for by swiveling the swivel arm. The suggested device is robust, long-lived and reliable.—The device provided by the invention ensures that the heating conductors are always held taut and precise, and in particular exactly parallel to each other. Even after a plurality of operating cycles, the heating conductors do not sag. Their distance to the substrate that is to be coated can always be kept reproducibly constant over a plurality of coating procedures.

The tension weight can be provided by the weight of the swivel arm itself. In a particularly simple case, the swivel arm can be a piece of flat metal tilted in the direction of tension.

According to an advantageous embodiment of the invention, the tension weight is at least partially created by a lever arm extending from the swivel arm. When suitably arranged, the weight of the lever arm is usually already sufficient to generate a sufficient tension force. Naturally, it can also be that an additional weight is mounted on the lever arm.

The lever arm advantageously extends from the second end of the swivel arm. In this case, a center of gravity of the tension unit is located in the vicinity of the second end of the swivel arm and thus in the vicinity of the horizontal axis. This provides a simple way to achieve a stable arrangement of the tension unit by simply placing it onto a suitably designed base.

The swivel arm is advantageously made from an electrically conductive metal. The second end of the swivel arm can be mounted or supported on the second electrode. An electrical connection between the heating conductor and the second electrode can be advantageously established exclusively via the swivel arm. With the suggested embodiment, a separate electrical connection between the heating conductor and the second electrode is advantageously no longer needed.

According to a particularly simple embodiment of the invention, the second end of the swivel arm is swivel-supported against an abutment provided on the second electrode. The abutment can be a step, a groove, a trough or similar. In this particularly simple embodiment, for example, the provision of a hinge to connect the swivel arm with a base, in particular with the second electrode is no longer needed.

According to a further embodiment, two adjacent heating conductors are created from a single wire whose both ends are held on a further swivel arm provided either on the swivel arm or on the first electrode. The two ends of the wire are thereby mounted on both sides of a swivel axis of the further swivel arm. This makes it possible to simultaneously keep the two adjacent heating wires taut.

According to a further embodiment, the heating conductors are made of a refractory metal, preferably from W, Ta, Mo, Rh or an alloy thereof. The suggested materials are suitable, on the one hand, for making particularly thin wires and, on the other hand, can be exposed to high thermal stress.

The heating conductors are advantageously wires having a diameter ranging from 5 μm to 600 μm, preferably ranging from 100 μm to 400 μm. Particularly when heating conductors with a small diameter are used, the required electrical power for coating a substrate can be significantly reduced. At the same time, a high temperature of the heating conductor can be achieved which supports the generation of atomic hydrogen.

The heating conductors do not absolutely have to be designed in the form of wires. It can also be that they are designed in the form of bands, rods or sheets. A diameter or a cross section area of the heating conductors does not have to be the same over their entire longitudinal extension.

According to a further embodiment, a holder unit is provided on the first electrode to mount the other end of the heating conductor. This can advantageously be a unit for mounting the heating conductor by clamping. The holder unit can in particular be designed so that mounting the heating conductors is possible without an essential bending of same.

According to a further embodiment of the invention, the first and/or second electrode is made of a dispersion-strengthened copper material. The suggested dispersion-strengthened copper material also maintains an extremely stable shape even at high temperature. Apart from this, work pieces, in particular profiles or hollow profiles, can be extruded simply and inexpensively from such a material and then processed.

A cooling unit for cooling the first and/or second electrodes is advantageously provided. For this purpose, the first and/or second electrodes can, for example, have the shape of a hollow profile through which a cooling fluid flows. The cooling fluid is advantageously water.

According to a further advantageous embodiment, the heating conductor array is designed as a module. In other words, the first and the second electrode are permanently connected relative to each other, with a plate for example, and form a structural unit. Such a structural unit is advantageously designed so that it can be located in a conventional housing of a CVD coating device.

According to further provisions of the invention, a method for coating a substrate using CVD, in particular for coating with diamond or silicon, is provided wherein the following steps are performed using the device provided by the invention:

Evacuation of the housing;

Generation of a reactive gaseous atmosphere containing hydrogen and a gaseous carbon carrier in the housing;

Heating up the heating conductors from the ambient temperature to a temperature ranging from 1500° C. to 2800° C. for a holding time of 1 to 100 hours;

Evacuation of the housing;

Cooling off the heating conductors to the ambient temperature.

During the evacuation of the housing, a pressure ranging from approximately 0.1 to 400 mbar is set inside. The pressure when generating the reactive gaseous atmosphere is 1 to 400 mbar, preferably 3 to 20 mbar. The reactive gaseous atmosphere advantageously contains 90 to 99.5 wt. % of hydrogen. To make a diamond lever, methane in a concentration of 0.5 to 10 wt. % can be used, for example, as the carbon carrier. To make a silicon layer, the reactive gaseous atmosphere can contain a gaseous silicon carrier instead of the gaseous carbon carrier. The reactive gaseous atmosphere can also optionally contain nitrogen, oxygen, phosphorus or gases containing boron.

The heating conductors are advantageously heated to a temperature ranging from 1800° C. to 2500° C., preferably 1900° C. to 2300° C. Particularly at the high temperatures specified, a graphite precipitation onto the heating conductors from the gaseous phase is avoided. This ensures that the generation of atomic hydrogen on the heating conductors is always maintained in particular even with high concentrations of the carbon carrier in the gaseous phase.—The cooling of the heating conductors to the ambient temperature takes place advantageously in a vacuum, in other words, not in the reactive gaseous atmosphere. The housing is aired after the heating conductors have cooled to the ambient temperature. The coated substrates are then removed.

Due to the further embodiment features of the method, reference is made to the features already described for the device which features can be applied analogously to the method.

Using the method provided by the invention, it is possible to perform up to 50 coating procedures in succession, without having to change the heating conductors. Advantageously, the heating conductors always remain taut thereby.

Figure 2:
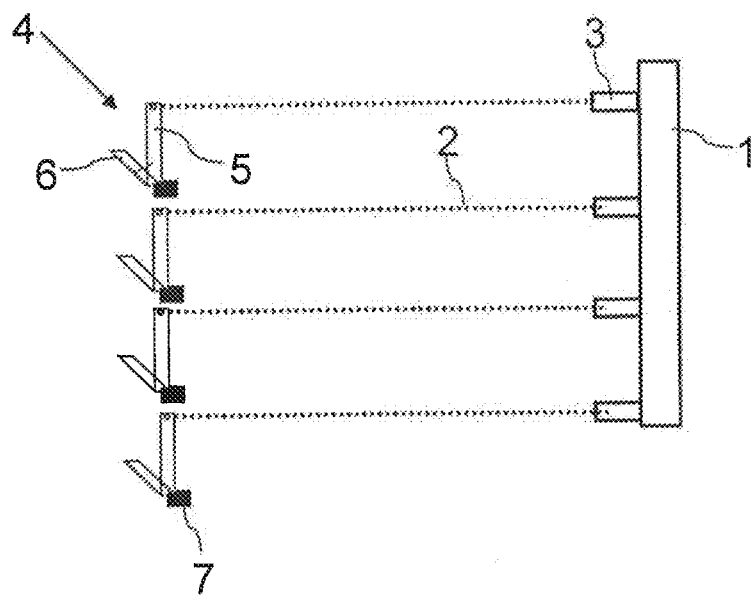
Figure 3:
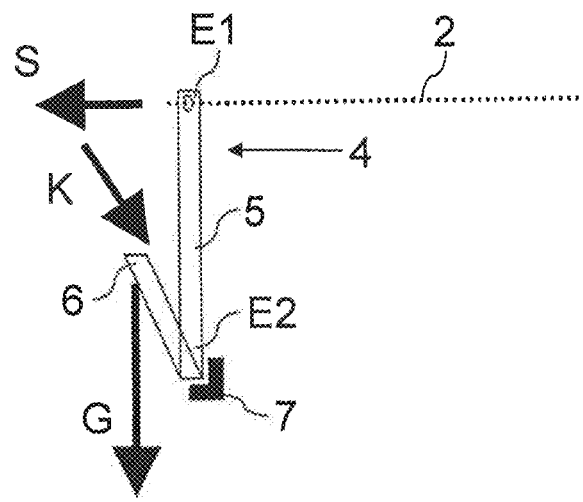

Examples will now be used to describe the invention in more detail based on the drawings. The following figures are listed:

FIG. 1 a schematic view of a first device,

FIG. 2 a schematic view of a second device,

FIG. 3 the distribution of forces for a tension unit as per FIGS. 1 and 2 and

Figure 4:
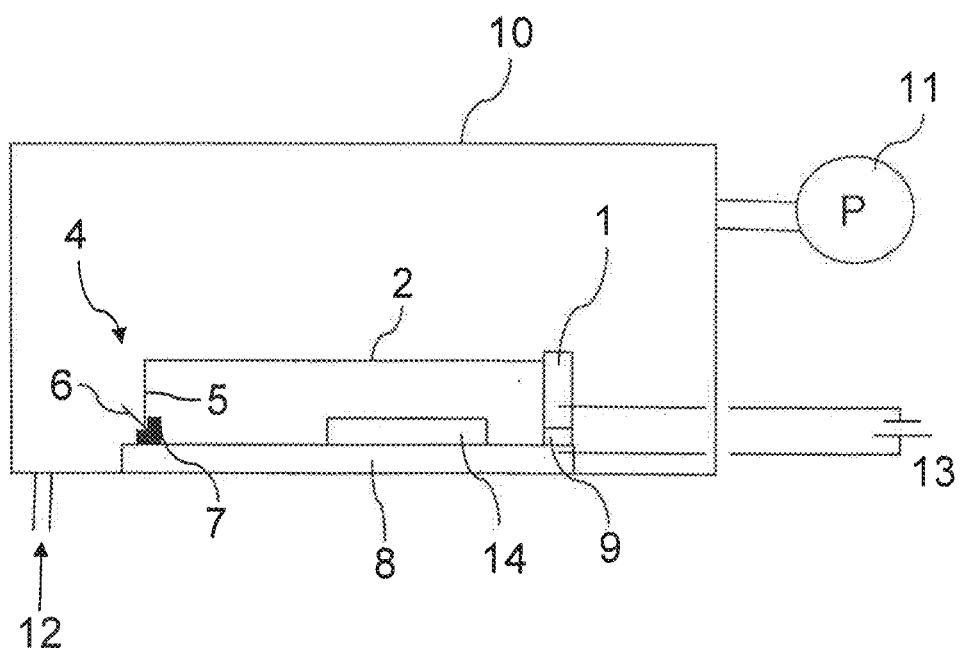

FIG. 4 a schematic sectional view of a CVD coating device.

FIG. 1 shows a schematic view of a first device. On a first electrode 1 are mounted a plurality of heating conductors 2 in a row in succession, preferably at approximately the same distance to each other. The heating conductors 2 can be held by clamping in holder units 3 which are provided on the first electrode 1. The heating conductors 2 are individually held taut by tension elements 4 provided on their end. Each of the tension elements 4 has a swivel arm 5 which can be swiveled around a horizontal axis H. One end of a heating conductor 2 is mounted on a first end E1 of each tension element 4. A lever arm 6 extends from a second end E2 in a direction away from the first electrode 1. The swivel arm 5 and the lever arm 6 which is firmly connected with it, for example by welding, form a pointed angle, preferably in range from 20 to 60°.— The force of the weight of the lever arm 6 exerts a tilting moment on the swivel arm 5 which forces this to move in a direction away from the first electrode 1. This exerts tension force on the heating conductor 2. The heating conductor 2 is held taut in a straight line between the first electrode 1 and the first end E1 of the tension element 4. This advantageously permits to omit a sliding contact or a special power supply cable connected with the heating conductor 2. With the first device shown in FIG. 1, the heating conductors 2 are arranged in an essentially horizontal plane next to each other.

Reference sign 7 indicates an abutment in which the tension element 4 is pivotably held. The abutment 7 can be a step in a simple case against which the second end E2 of the tension element 4 is supported. The abutment 7 can, for example, be part of a second electrode. Having an electrically conductive formation of the tension elements 4, an electrical connection between the heating conductor 2 and the second electrode can thus be made in a simple way. In this case, the tension unit is part of the second electrode 8 which can be moved relative to the first electrode 1 for tensioning the heating conductor 2. In other words, in this case, the heating conductor 2 is held taut in a straight line by the electrodes 1, 8 which can be moved relative to each other. Thus an undesired bending of the heating conductor 2 can be avoided which can sometimes be caused by a sliding contact on an electrode 1, 8 or a redirection unit.

In the device shown in FIG. 2, the first electrode 1 is arranged approximately vertically. For tensioning the heating conductors 2 in turn tension elements 4 are provided which, however, are arranged here in a vertical direction one above the other.

FIG. 3 schematically shows the distribution of forces on the tension element 4. A heating conductor 2 which is tensioned by the tension element 4 extends between the first electrode 1 (not shown here) and the first end E1 of the tension element 4. From now on, the direction of the heating conductor 2 will be called the "longitudinal extension." Caused by the effect of the weight force G caused by the lever arm 6 which weight force G has a vertically directed vector, a tilting moment is exerted on the swivel arm 5 which causes a tension force S. The vector of the tension force S runs parallel to the longitudinal extension of the heating conductor 2. Reference sign K indicates a contact force which acts in the oblique direction of the abutment 7.

FIG. 4 shows a schematic sectional view of a CVD coating device. The abutment 7 are thereby mounted on a second electrode 8 designed in the form of a horizontal plate. The first electrode 1 is connected with the second electrode 8 being interconnected with an electrical insulator 9. In all this provides a compact heating conductor array which is designed as a module. Reference sign 10 indicates a gas-tight housing which surrounds the heating conductor array. Since particularly the first 1 and the second electrode 8 are located inside the housing 10, a power supply can be advantageously designed to power the electrodes 1, 8 in a simple manner. The power supply must in particular not be movable relative to a wall of the housing 10.

A pump 11 is provided for the evacuation of the housing 10. Reference sign 12 indicates a pipe via which reactive gas can be led into the housing if desired. The first 1 and the second electrode 8 are connected with a power source 13 to heat the heating conductors 2. Reference sign 14 indicates a substrate which is supported on the second electrode 8 for coating.

REFERENCE SIGNS

1 First electrode
2 Heating conductor
3 Holder unit
4 Tension element
5 Swivel arm
6 Lever arm
7 Abutment
8 Second electrode
9 Electrical insulator
10 Housing
11 Pump
12 Pipe
13 Source of power
14 Substrate
G Force of weight
H Horizontal axis
K Contact force
S Tension force

The invention claimed is:

1. A device for coating a substrate using CVD, for coating with diamond or silicon, comprising:
   a heating conductor array comprising a plurality of heating conductors, each being electrically connected with a first electrode and a second electrode and being longitudinally extended and arranged next to each other in an essentially horizontal plane,
   wherein the second electrode comprises a plurality of tension units,
   each tension unit is individually movable relative to the first electrode so that each of the plurality of heating conductors is held taut in a straight line between the first electrode and the second electrode,
   each tension unit comprises a swivel arm having a tension weight, and
   each of the plurality of heating conductors is mounted on a first end of the swivel arm and a second end of the swivel arm is mounted pivotably essentially around a horizontal axis.

2. The device as defined in claim 1, wherein the tension weight is at least partially formed by a lever arm extending from the swivel arm.

3. The device as defined in claim 1, wherein a lever arm extends from the second end of the swivel arm.

4. The device as defined in claim 1, wherein the swivel arm is made of an electrically conductive metal.

5. The device as defined in claim 1, wherein the second end of the swivel arm is mounted on the second electrode.

6. The device as defined in claim 1, wherein an electrical connection is made between each of the plurality of heating conductors and the second electrode exclusively via the swivel arm.

7. The device as defined in claim 1, wherein the second end of the swivel arm is supported against an abutment provided on the second electrode.

8. The device as defined in claim 1, wherein two adjacent heating conductors of the plurality of heating conductors are formed from a single wire whose both ends are held by a first and second swivel arm.

9. The device as defined in claim 1, wherein the plurality of heating conductors is made of a refractory metal.

10. The device as defined in claim 9, wherein the refractory metal is W, Ta, Mo, Rh or an alloy thereof.

11. The device as defined in claim 1, wherein the plurality of heating conductors has a diameter of 5 to 600 μm.

12. The device as defined in claim 11, wherein the plurality of heating conductors has a diameter of 100 to 400 μm.

13. The device as defined in claim 1, wherein the first electrode and/or the second electrode is made of a dispersion-strengthened copper material.

14. The device as defined in claim 1, wherein a cooling unit is provided for cooling the first electrode and/or the second electrode.

15. The device as defined in claim 1, wherein the heating conductor array is designed as a module.

* * * * *